(12) United States Patent
Lindberg et al.

(10) Patent No.: US 6,900,683 B2
(45) Date of Patent: May 31, 2005

(54) APPARATUS AND METHOD FOR GENERATING A PREDETERMINED TIME DELAY IN A SEMICONDUCTOR CIRCUIT

(75) Inventors: Mikael Lindberg, Täby (SE); Stefan Davidsson, Skärholmen (SE); Ulf Hansson, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/433,518
(22) PCT Filed: Dec. 5, 2000
(86) PCT No.: PCT/SE00/02434

§ 371 (c)(1),
(2), (4) Date: Jun. 2, 2003

(87) PCT Pub. No.: WO02/47269

PCT Pub. Date: Jun. 13, 2002

(65) Prior Publication Data

US 2004/0012429 A1 Jan. 22, 2004

(51) Int. Cl.$^7$ ............................................. H03H 11/26
(52) U.S. Cl. ......................... 327/261; 327/162; 327/285
(58) Field of Search ................................ 327/258, 261, 327/268–272, 284, 285, 295, 296, 392, 393, 407, 141, 144, 149, 152, 153, 158, 159, 161, 162; 326/93

(56) References Cited

U.S. PATENT DOCUMENTS

| | | | |
|---|---|---|---|
| 5,539,687 A | * 7/1996 | Torisawa et al. ............ 708/815 |
| 5,544,068 A | 8/1996 | Takimoto et al. | |
| 5,740,123 A | 4/1998 | Uchida | |
| 5,870,445 A | * 2/1999 | Farwell ........................ 375/371 |
| 5,994,938 A | * 11/1999 | Lesmeister ................... 327/277 |
| 6,011,732 A | * 1/2000 | Harrison et al. ............. 365/194 |
| 6,049,239 A | 4/2000 | Eto et al. | |
| 6,100,735 A | * 8/2000 | Lu ............................... 327/158 |
| 6,125,157 A | * 9/2000 | Donnelly et al. ............ 375/371 |
| 6,157,226 A | * 12/2000 | Ishimi .......................... 327/116 |
| 6,229,358 B1 | * 5/2001 | Boerstler et al. ............ 327/116 |
| 6,232,812 B1 | * 5/2001 | Lee .............................. 327/277 |
| 6,285,226 B1 | * 9/2001 | Nguyen ....................... 327/175 |
| 6,369,624 B1 | * 4/2002 | Wang et al. ................. 327/156 |
| 6,373,913 B1 | * 4/2002 | Lee .............................. 375/376 |

* cited by examiner

*Primary Examiner*—Timothy P. Callahan
*Assistant Examiner*—Hai L. Nguyen (57) ABSTRACT

A semiconductor arrangement is provided for generating a predetermined time delay. Two clocks are connected to two parallel, redundant semi-conductor circuits emitting clock signals from multiplexers. The redundant circuits receive delayed clock signals from one of the clocks, and from the other clock, clock signals that are delayed in adjustable delay circuits to be phased in with the clock signals from the first clock. A number of delay elements and a first reference number of delay elements, providing a predetermined delay time, are connected in a reference delay circuit. A quotient of the two numbers is stored. One of the semi-conductor circuits is replaced by an alternative semi-conductor circuit, the reference delay circuit of which is set on the predetermined delay time, corresponding to a second reference number of delay elements. An adjustable delay circuit is set on the same delay time as the replaced semi-conductor circuit by means of the second reference number and the quotient.

13 Claims, 7 Drawing Sheets

APPARATUS AND METHOD FOR GENERATING A PREDETERMINED TIME DELAY IN A SEMICONDUCTOR CIRCUIT

FIELD OF THE INVENTION

The present invention relates to an apparatus and a method in connection with a semi-conductor circuit provided with a delay circuit in order to time-delay a signal. The delay circuit be set on a predetermined delay interval.

DESCRIPTION OF RELATED ART

In synchronous networks, e.g. synchronous telephony networks, the nodes of the network must fulfil certain network synchronisation requirements in order to be able to cooperate. These requirements must be fulfilled also when maintenance work is performed on the network and in cases when errors occur. In many cases, high demands are also put on the robustness of the networks, and the nodes are therefore provided with redundant units. Synchronisation problems are often revealed, when one of the redundant units in a node is to be exchanged. The units are provided with semi-conductor circuits causing certain signal delays and furthermore having specific delay circuits, the task of which is to delay the signals in a predetermined way. Thus, the problem is that the different specimen of the redundant units are different among themselves. This difference is due to difficulties in manufacturing totally identical semi-conductor circuits. Therefore, different redundant signal paths cause different delays and when switching between signal paths there may occur phase hops being greater than permitted by the network specifications. The extent of the problems is also dependent on the bit rate on the outgoing links.

The problems have been solved in different ways due to this bit rate. At low bit rates, e.g. 1,5 Mbit/s, the phase hops are often smaller than a bit period and the occurring disturbances can be tolerated. At high bit rates, e.g. 155 Mbit/s, the problem is significant and has been solved in such a way that the phase hops are handled in the units being located after the redundant units. For such a solution, five different clock signals are collected from each of the redundant units. These clock signals are put together into three separate signals, each of which is delayed in its associated adjustable delay circuit and the signals are then compared in couples. The resulting phase differences are processed in a microprocessor controlling the adjustable delay circuits enabling the production of a common outgoing signal. This solution of the problem is complicated and expensive.

The U.S. patent document U.S. Pat. No. 5,952,857 describes a semiconductor circuit having controllable delay circuits. Input signals within a time interval are compared and delayed in the delay circuits in relation to the last received one of the signals. By this adjustment, the requirement of a predetermined phase relation between the circuit and a clock phase is avoided.

The U.S. patent document U.S. Pat. No. 5,663,668 describes a circuit comprising the generation of internal clock signals having separate phases, the generation being controlled by an external clock signal. The internal signals are to reach separate blocks in the circuit simultaneously. The signal paths to the blocks have different delays and by weighting these delays together with the separate clock phases the desired simultaneousness is obtained.

An article by David L. Mills, Electrical Engineering Department, University of Delaware, issued 1994, describes theoretically the synchronisation of local clocks in a network.

None of the above documents deals with the problem related to how a predetermined signal delay is to be preset in a semiconductor circuit. Neither is the problem related to separate delay characteristics of different specimens of the semi-conductor circuits tackled.

SUMMARY OF THE INVENTION

The present invention attacs a problem related to how an adjustable delay circuit, being part of a semi-conductor circuit, is to be set on a predetermined time delay. The delay circuit is built up by a number of delay elements, the elements having different time delay om different of the semiconductor circuits due to difficulties during the manufacturing.

Another problem that is attacked is the synchronisation of the semi-conductor circuit with a synchronous network by presetting the delay circuit.

A further problem is to provide the possibility, when an error occurs in the semi-conductor circuit, to exchange said semi-conductor circuit during operation for another semi-conductor circuit maintaining the network synchronisation.

The problem is solved by providing the semi-conductor circuit with a reference delay circuit, which is calibrated be means of a time interval having a known length. The adjustable delay circuit is set on its predetermined time delay using a comparison with the reference delay circuit.

To be a bit more specific, the problem is solved by simultaneously manufacturing both the adjustable delay circuit and the reference delay circuit, using the same process parameters, on a common semi-conductor substrate. Thus, the delay elements in the delay circuits are provided with comparable delay times. Then, the adjustable delay circuit may be set using a comparison with the reference delay circuit, when it is calibrated.

The problem when exchanging a semi-conductor circuit is solved in the following way. As long as the semi-conductor circuit is in operation, the number of activated delay elements in both the adjustable delay circuit and in the reference delay circuit are counted. These values are used for setting the adjustable delay circuit of the newly installed semi-conductor circuit, once its reference delay circuit has been calibrated with the known time interval.

Thus, an object with the present invention is, in the semi-conductor circuit, to be able to set the adjustable delay circuit at a predetermined time interval. This shall be possible in spite of the fact that the delay elements in the delay circuit have a delay that may strongly vary from one semiconductor circuit to the next.

Another object is to be able to synchronise the semi-conductor circuit with the synchronous network without the occurrences of phase hops. This synchronisation is obtained by presetting the delay circuit.

Still an object is to be able to exchange the semi-conductor circuit in operation maintaining the network synchronisation.

An advantage with the invention is that the delay circuit may be accurately preset at a desired delay time without the exact time delay of the delay elements being accurately known.

Another advantage is that the semi-conductor circuits may be exchanged in operation maintaining the network synchronisation.

A further advantage is that the lack of network synchronisation eventually caused by the semi-conductor circuit when it is exchanged, is corrected immediately in the exchanged circuit. The solution is simple and economical, as no complicated circuits after the exchanged semi-conductor circuit are required in order to maintain the network synchronisation.

Yet another advantage is that the invention allows an accurate presetting of the semi-conductor circuit so that the network synchronisation is maintained also in synchronous network having a high bit rate.

The invention will now be disclosed in more detail in conjunction with preferred embodiments and the accompanying drawings.

DETAILED DESCRIPTION OF EMBODIMENTS

Figure 1:
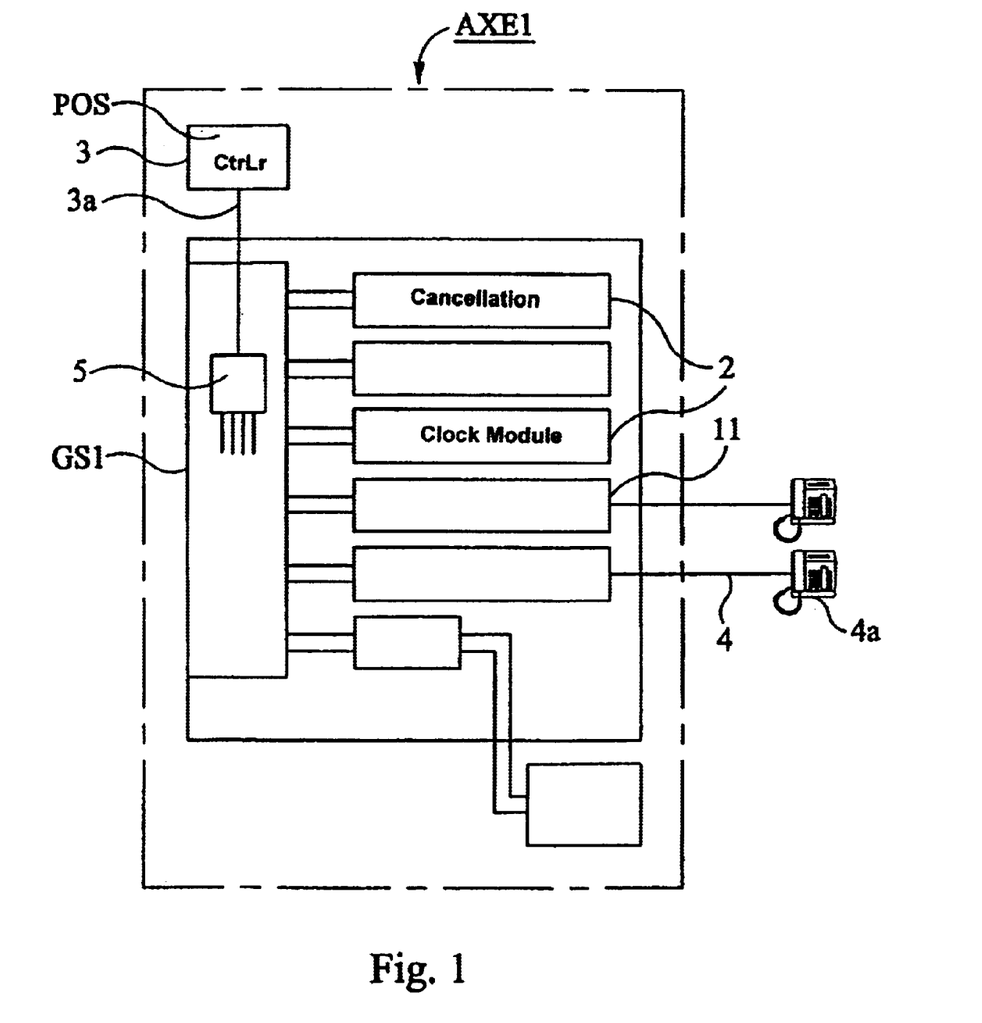
FIG. 1 illustrates a schematic block diagram of a selector in a telephone exchange.

FIG. 1 illustrates very schematically parts of a telephone exchange AXE1. Here, a selector GS shown with associated units 2 and 11 as well as a master controller 3 being connected to the selector through a connection 3a. An echo cancellation unit and a clock module may serve as illustrations of said connected units 2. Connections 4 between the exchange and the network are also shown, wherein the network is symbolised by telephones 4a. The selector comprises a unit 5 for distributing clock signals, the unit being connected to the controller 3 and which will be described more in detail below.

Very high demands are put on the robustness of the units in a telecommunication system, and in order to fulfil these demands redundancy is designed in the units of the network, e.g. in the exchange AXE1. The network to which the exchange AXE1 is connected is a synchronous network, where the demands on network synchronisation are very high in order to enable the nodes of the network to cooperate. These demands on synchronisation must be fulfilled, also when errors occur in the network, or when maintenance work is performed. Synchronisation problems often occur when switching from one signal path to the next, and the cause of the problems is that the different signal paths may have signal delays of different size. A switch of signal path may cause a phase hop being greater than the specifications allow and may interrupt a number of established connections. The synchronisation demands are dependent on the bit rate on the outgoing links. Therefore, it is much easier to fulfil demands set for a bit rate of 1,5 Mbit/s than for a bit rate of 155 Mbit/s. The latter bit rate is being introduced in telecommunication systems with telephone exchanges belonging to it.

Figure 2:
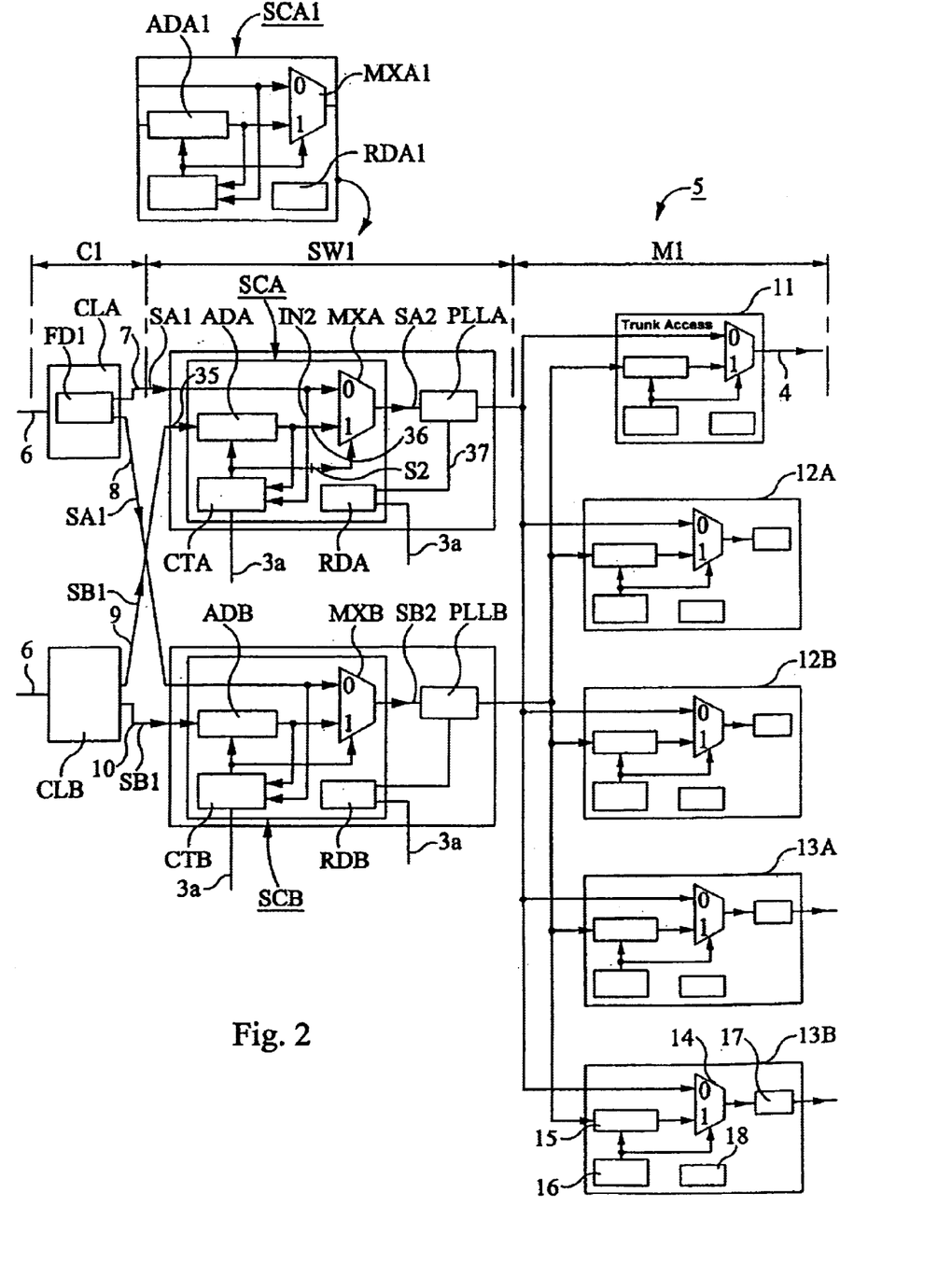
FIG. 2 illustrates a block diagram of a part of the selector.

FIG. 2 illustrates the unit 5 in more detail. The unit can be said to have three main parts, a part C1 having clocks, a switch part SW1 and a multiplexer part M1. The three parts are each provided with parallel, doubled units, which are the above-mentioned redundant units. Thus, part C1 is provided with two clocks CLA and CLB, which through connections 6 are connected to a not shown synchronisation reference for the exchange AXE1. The clock CLA is provided with a fixed delay circuit FD1, whereas the clock CLB lacks delay circuit. The switch part SW1 comprises two parallel integrated circuits SCA, SCB respectively, which are included in the exchange core of the exchange AXE1. The circuit SCA comprises an adjustable delay circuit ADA, the output 36 of which is connected to a 1-input of a multiplexer MXA. Correspondingly, the circuit SCB is provided with an adjustable delay circuit ADB, the output of which is connected to a 1-input of a multiplexer MXB. The integrated circuits are each provided with a separate control circuit, CTA, CTB, respectively, the control output of which is connected both to a control input of the adjustable delay circuit, and to a control input of the multiplexer. The control circuits CTA and CTB are connected to the central controller 3 through the connection 3a. Finally, the integrated circuits are each provided with a separate reference delay circuit, RDA, RDB, respectively, which are connected to the controller 3 through the connection 3a. The clock CLA is by means of its delay circuit FD1 connected both to a 0-input of the multiplexer MXA, and to an input IN2 of the control circuit CTA via a connection 7. Also, the output 36 is connected to an input of the control circuit CTA. The same clock CLA is through its delay circuit FD1 connected both to a 0-input of the multiplexer MXB, and to an input of the control circuit CTB via a connection 8. The clock CLB is both, through a connection 9, connected to an input 35 of the adjustable delay circuit ADA, and via a connection 10 connected to an input of the adjustable delay circuit ADB. An output of the multiplexer MXA is connected to a phase locked loop PLLA having a delay circuit and the multiplexer MXB is provided with an output connected to a phase locked loop PLLB. The reference delay circuit is connected to the phase locked loop through a connection 37.

It should be carefully noted that the integrated circuit SCA, which thus is provided with the adjustable delay circuit ADA, the reference delay circuit RDA, the control circuit CTA and the multiplexer MXA, form a common integrated circuit. In the same manner, the integrated circuit SCB is another common integrated circuit. This is of significance for the present invention, as will be described more in detail below.

The outputs of the switch part SW are connected to the units 12A and 12B, as well as 13A and 13B of the multiplexer part M1, as is shown in the figure. The unit 11, which is also connected to the integrated circuits SCA and SCB, is not included in the multiplexer part, but is instead a trunk access. Like the integrated circuits SCA and SCB, these units each have an associated multiplexer 14, an associated adjustable delay circuit 15 and an associated control circuit 16. Also, the units 12A, 12B and 13A, 13B each have a phase locked loop 17 and a reference delay circuit 18. The unit 11 is connected to the network 4 and the remaining units in the multiplexer part are also connected to the network through further circuits, not shown in the figure. The units 11, 12A, 12B, 13A and 13B are shown in less detail than the integrated circuits SCA and SCB.

It is of significance for network synchronisation of the system that the redundant units, e.g. the integrated circuits SCA and SCB, are mutually in phase. This means that the clock signals SA2 and SB2 being distributed to the multiplexer unit M1 and further out in the system, are very well synchronised. Timing deviations may occur when the clocks CLA and CLB are slightly different, when the connection lines 7, 8, 9 and 10 have mutually different delays and the two integrated circuits SCA and SCB themselves induce separate signal delays. Therefore, the clock signals may become mutually phase displaced.

The clock signals SA2 and SB2, outputted from the multiplexer MXA, MXB, respectively, are kept mutually in phase in the following manner. Clock signals SA1 from the clock CLA are delayed in the fixed delay circuit FD1 with a time interval, which with certainty exceeds the above mentioned timing deviations and according to the example, the time interval is selected to 20 ns ($20*10^{-9}$ seconds). The clock signals SA1 are connected to the 0-input at the multiplexers MXA and MXB, respectively. Clock signals SB1 from the clock CLB are non-delayed when they are outputted from the clock, but are delayed in the adjustable delay circuits ADA and ADB, respectively. After the delay, they are connected to the 1-input of the multiplexers MXA and MXB, respectively. The delay times in the adjustable delay circuits are set by means of the clock signals SA1 and SB2, as will be explained in more detail below. Thus, the two inputs 0 and 1 become completely mutually in phase on the two multiplexers MXA and MXB, and the desired common phase for the clock signals is always maintained. The control circuit, CTA and CTB respectively, set the multiplexer so that during normal, undisturbed operation, the 0-input having the clock signal SA1 is connected to the output. The 1-input of the multi-plexer is used when an error occurs at e.g. the clock CLA, or its connection lines 7 and 8.

The clock signal SA2 is delayed a time interval 20 ns in the circuit PLLA and the clock signals are then fed to the multiplexer part M1. In the same way as disclosed above, the redundant units 12A and 12B as well as 13A and 13B are synchronised.

As mentioned above, the robustness requirements on the exchange AXE1 are high in order to maintain the network synchronisation, even when an error occurs in the exchange. Such an error may be that the integrated circuit SCA is damaged and must be replaced and that the clock CLA is out of order. At the occasion, when the circuit is damaged, the phase locked loop PLLA is able to maintain the synchronisation until the circuit SCA is disconnected, whereupon the redundant integrated circuit SCB alone controls the network synchronisation. For this purpose, the clock signal SB1 from the remaining clock CLB is used, and the clock signal is delayed in the delay circuit ADB. Now, the problem arises that the old circuit SCA must be replaced by a new integrated circuit SCA1, as is hinted in FIG. 2. However, before the new circuit SCA1 is connected, its associated adjustable delay circuit ADA1 is set at an adequate delay interval corresponding to the delay in the delay circuits ADA. Thus, the clock signals SA2 and SB2 are sufficiently synchronised from the first instant. No phase hops occur at the connecting up, the network synchronisation is maintained and the adjustable delay circuit ADA1 can be sharply tuned. Before the above connecting up of the new integrated circuit SCA1 is described in more details, the delay circuits and theirs associated settings will first be described more in detail.

Figure 3:
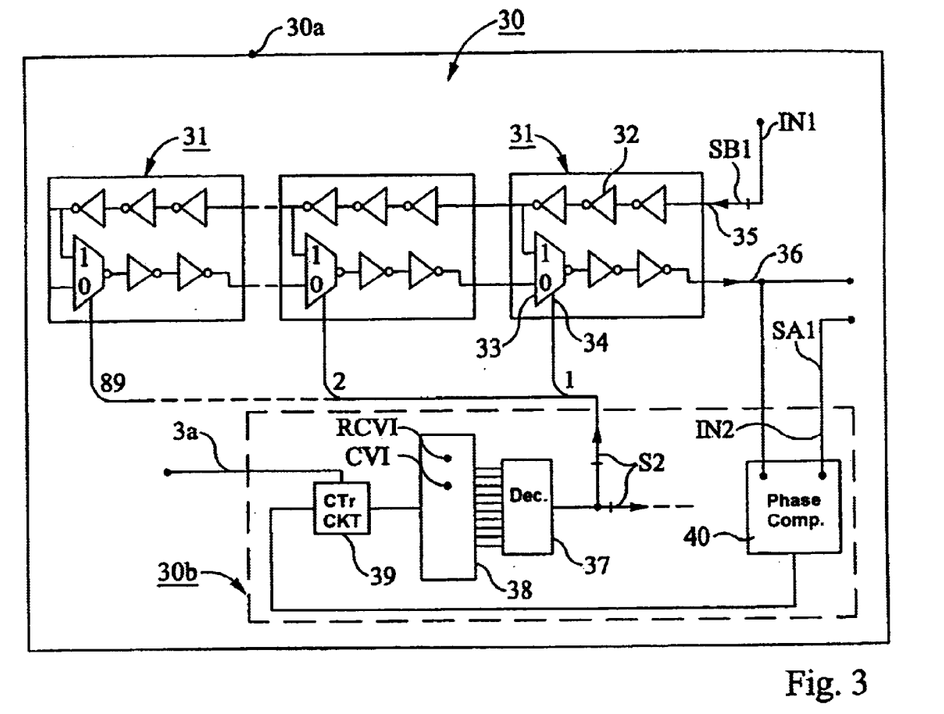
FIG. 3 illustrates a block diagram of a delay circuit.

FIG. 3 illustrates in more detail a block diagram of a per se known delay circuit 30 on a semi-conductor substrate 30a. The circuit 30 has series coupled delay elements 31 that in this example comprises 89 items, according to the numbered taps 1–89. Each delay element is provided with five inverters 32, each of which delays a signal a time interval that coarsely could be set to about 0,2 ns. Each of the delay elements 31 have also an associated inverting multiplexer 33 having, coarsely estimated, a delay time of 0,1 ns. Each of the multiplexers have an associated control input 34 that is connected to a decoder 37, that in turn is connected to an up/down-counter 38. The latter is, through a control circuit 39, connected to a phase comparator 40 having an input IN2 for clock signals. The connection 3a to the master control unit 3 is connected to the control circuit 39. The multiplexers 33 may be reset through its control input, so that its input 0 or 1 is connected to the associated output and transmits a signal. The first delay element 31 of the delay circuit 30 is provided with the input 35 and the output 36 for the clock signal SB1 that is to be delayed. In the figure, the decoder 37, the up/down-counter 38, the delay circuit 39 and the phase comparator 40 are shown in a frame of dashed lines as a unit 30b. This unit is the control circuit CTA in FIG. 2. The delay elements 31 operate so that the clock signal SB1 at the input 35 passes and is delayed in the inverters 32. If the 0-input of the element multiplexer 33 is connected to the output of the multiplexer, the 1-input of which is closed and the signal is transmitted further to the next delay element. In this element the 1-input of the multiplexer may be open, and the signal SB1 is then returned and transmitted further, through the multiplexer and the inverter, back to the first delay element and continues through its multiplexer 33 and two of the inverters to the output 36.

Above, it has been stated that the delay time in one of the inverters 32 is about 0,2 ns and in one of the multiplexers 33 the delay time is about 0,1 ns. It should be carefully noted that it is possible to manufacture the delay circuit 30, so that all the inverters 32 are mutually provided with nearly the same delay time and all the multiplexers 33 are provided with mutually the same delay time. This is true, when the inverters and the multiplexer are manufactured on a common substrate, e.g. the substrate 30a. Then, all the elements are manufactured at the same time and having the same process parameters. The same also apply when several delay circuits are manufactured on the same semi-conductor substrate at one and the same occasion; all the inverters are mutually identical and all the multiplexers are also mutually identical. However, if two of the delay circuits 30 are manufactured on separate semi-conductor substrates, at different occations, the inverters and the multiplexers of these two delay circuits will have different delay times. The reason is that it is very difficult to manufacture two identical semi-conductor substrates and maintain all the process parameters exactly identical at two separate manufacturing occations.

The delay circuit 30, which in the example below represents the adjustable delay circuit ADA, is set at a desired delay time in the following way. The clock signal SB1 at the input IN1 is fed to the input 35 of the first delay element. There, the signal is returned and fed back to the phase comparator 40. The second clock signal SA1, that in the embodiment is delayed by a time interval in the order of 20 ns compared with the first clock signal, is fed to the input IN2. The clock signal SB1 that has been delayed in the delay elements 31 and the clock signal SA1 are fed to the phase comparator 40, wherein they are compared. According to the comparison, the control circuit resets the up/down-counter 38, and through the decoder a control signal S2 is emitted that resets the multiplexers 33. As long as the clock signal SB1 that has been delayed in the delay elements 31 is located before the second clock signal SA1, the up/down-counter 38 is incremented and more and more of the delay elements 31 are connected through the decoder 37 until the two clock signals are completely mutually in phase.

Thus, in this way, the adjustable delay circuit ADB is set. E.g. the adjusting process is performed at a time, when the unit 5 in the selector GS1 is put into operation. The two clock signals at the inputs 0 and 1 of the multiplexer MXA are mutually in phase at normal operation and are also in phase with the clock signals at the inputs 0 and 1 of the multiplexer MXB. When this state occurs, the adjustable delay circuits ADA and ADB are stopped, and the setting of the delay circuits may be read on the setting of the up/down-counter 38. Thus, in this example, the setting of the up/down-counter 38 for the circuit SCA is a value CV1=30, i.e. a first number of 30 delay elements are connected.

Correspondingly, the reference delay circuit RDA is set on a time delay of a predetermined length. Clock pulses are fed to the two inputs IN1 and IN2 from the 48 MHz phased locked loop PLLA. This will be described more in detail in connection with the FIGS. 9a and 9b. The pulses have a time distance of T0=20 ns, which is shown with pulses CL1 and CL5 in FIG. 4. This figure is a time diagram of the pulses and t denotes the time and A denotes the pulse amplitude. The first pulse CL1 at the input IN1 is delayed in the first one of the delay elements 31. It arrives delayed at the output 36 and is then denoted CL2. This pulse does not coincide with any pulse at the input IN2, and therefore the up/down-counter 38 is incremented a step and the second delay element 31 is connected. A new clock pulse CL1 arrives further delayed at the output 36, and is denoted CL3. The up/down-counter is incremented a further step and so on until the delayed pulse CL1, now denoted CL4, coincide with the pulse CL5, coming immediately after the pulse CL1. Thus, the reference delay circuit RDA is stopped at the delay T0=20 ns. The up/down-counter in the reference delay circuit RDA has now a welldefined location that in the example has a value RCV1=20, i.e. a second number of 20 delay elements are connected in the reference delay circuit. The two values CV1=30 and RCV1=20 are read and transmitted to the unit 3 and a quotient $$POS=CVI/RCVI \quad (1)$$

is calculated and stored in the master control unit 3 in FIG. 1. In this example, the result is POS=30/20=1,5.

Figure 9A:
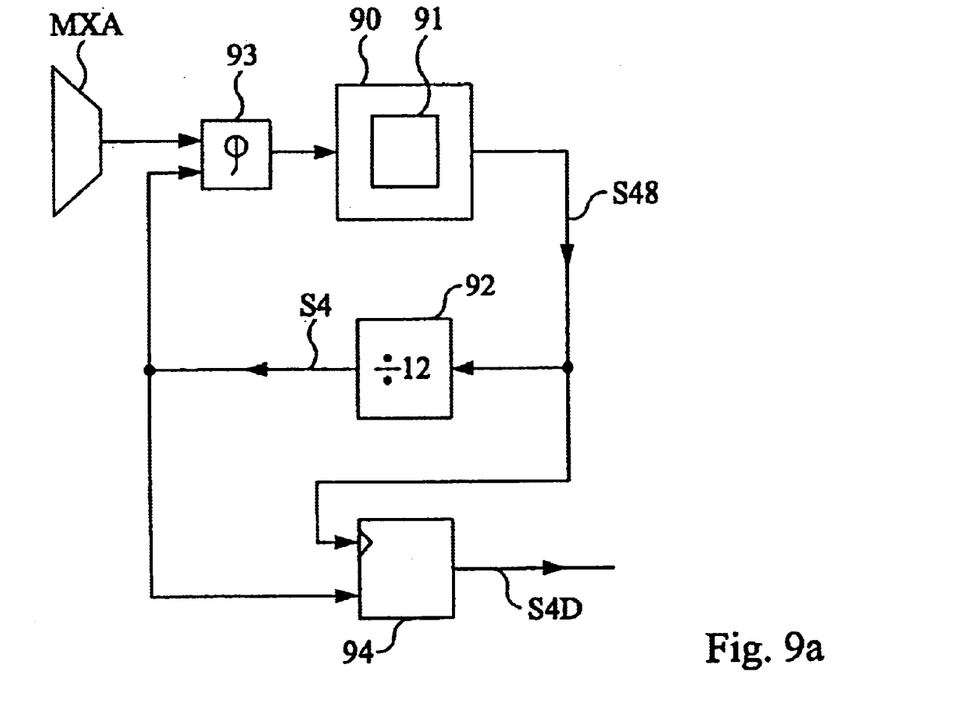
FIG. 9a illustrates a block diagram of a phase locked loop.
Figure 9B:
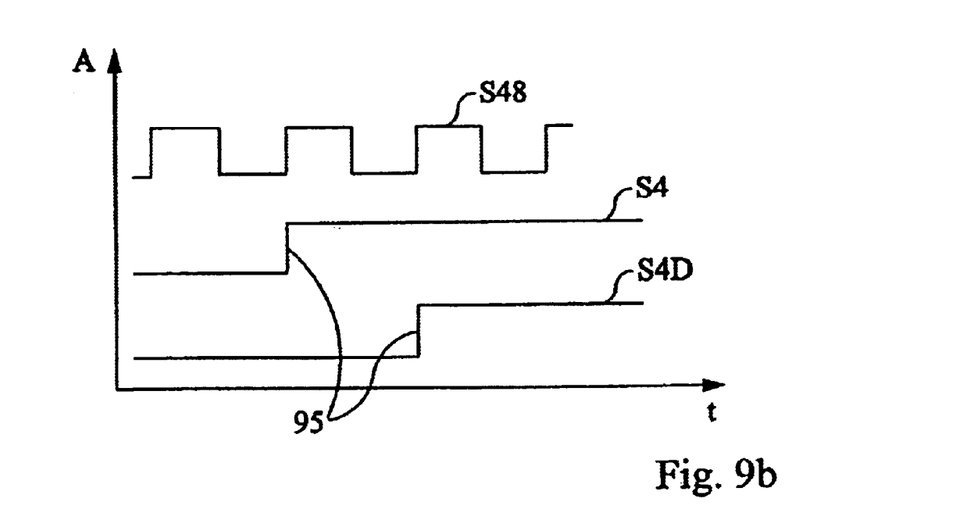
FIG. 9b illustrates a timing diagram of clock pulses.

The time distance T0 used for setting the reference delay circuit obtained from the phase locked circuit PLLA and PLLB, respectively. In FIG. 9a, the design of the phase locked loop PLLA is shown more in detail. A circuit 90 comprises a local oscillator 91 generating a 48 MHz signal S48. This signal is fed to a divider 92 dividing the period of the signal S48 with 12 into a 4 MHz signal S4, which is fed to a phase comparator 93. The phase comparator also receives the clock signal SA2, compares the phase of the signals S4 and SA2 and controls the local oscillator 91. The signals S4 and S48 are fed to a flip-flop 94 that emits a 4 MHz signal S4D that is delayed exactly a clock period of the signal S48. In FIG. 9b, a time diagram is shown, wherein t denotes the time and A denotes the amplitude. The signals S48, S4 and S4D are illustrated in the diagram. The signal S48 has a clock period S48 that is equal to the time distance T0. According to the disclosure above, this signal controls the generation of the signals S4 and S4D, which have edges 95 having a time distance T0. These edges are used for setting the reference delay circuit RDA at the time distance T0=20 ns.

As mentioned above, there may arise synchronization problems in the exchange AXE, e.g. when the circuit SCA is damaged and the clock CLA is out of order. Then, the circuit SCA is to be exchanged for the circuit SCA1, as is hinted with an arrow in FIG. 2. In order to avoid the synchronization problems, the adjustable delay circuit of the circuit SCA1 is set at a start value accurately enough. This setting is obtained in the following way.

When the new circuit SCA1 is installed, the reference delay circuit RDA1 is first set in the same way as described above for the circuit SCA. The setting is performed before the circuit SCA1 is connected for participating in the process of synchronizing the two clocks CLA and CLB in FIG. 2. When the clock pulses S4 and S4D having the time distance T0=20 ns are connected, a third number of delay elements 31 of the reference delay circuit RDA1 are connected. In this example, the number is 38 and this involves that the value RCVI1=38 for the circuit SCA1. Now, the adjustable delay circuit ADA1 is to be set at a start value CVI1. For this purpose the calculation $$CVI1=POS*RCVI1=1,5*38=57 \quad (2)$$

is performed. Therefore, in the adjustable delay circuit ADA1, a fourth number of 57 of the delay elements 31 are connected by means of a setting on the up/down-counter 38. This results in a delay time of the clock pulses SB1 equal to the delay in the prior delay circuit ADA. Thus, the two clock signals SA2 and SB2 from the multiplexers will be mutually in phase, in spite of the fact that the clock CLA is out of order. Therefore, it should be observed that the 57 delay elements of the delay circuit ADA1 represent a welldefined delay time, but that it is not necessary to know the value of this delay time. As described above, it is difficult to obtain two identical semi-conductor circuits, when they are manufactured on two different semi-conductor substrates and having somewhat different process parameters, therefore the number of delay elements is different in the circuits SCA and SCA1.

In the example above, it was assumed that the clock CLA was out of order, when the circuit SCA was exchanged. When the clock functions again, the phase of the two clock pulses SA1 and SB1 may differ a little at the inputs 0 and 1 of the multiplexer MSA, in spite of the described presetting. However, such a discrepancy is corrected by letting the clock signals SA1 and SB1 sharply tune the adjustable delay circuit ADA1, as described above.

Figure 4:
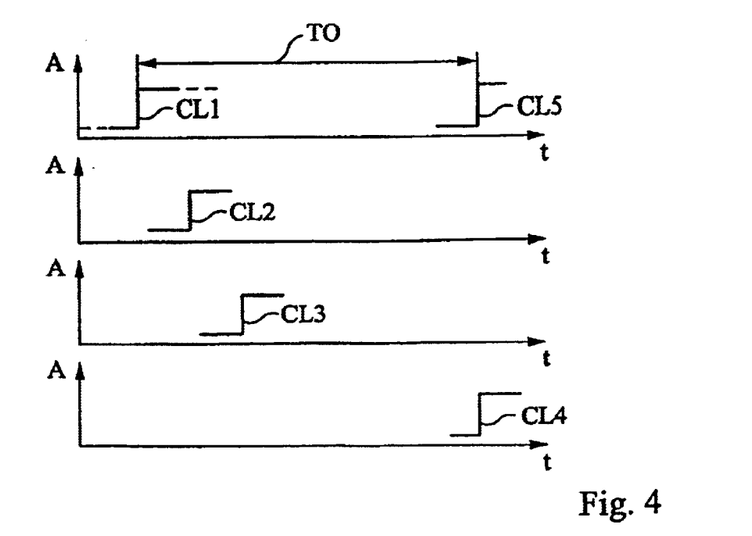
FIG. 4 illustrates a timing diagram with clock signals.
Figure 5:
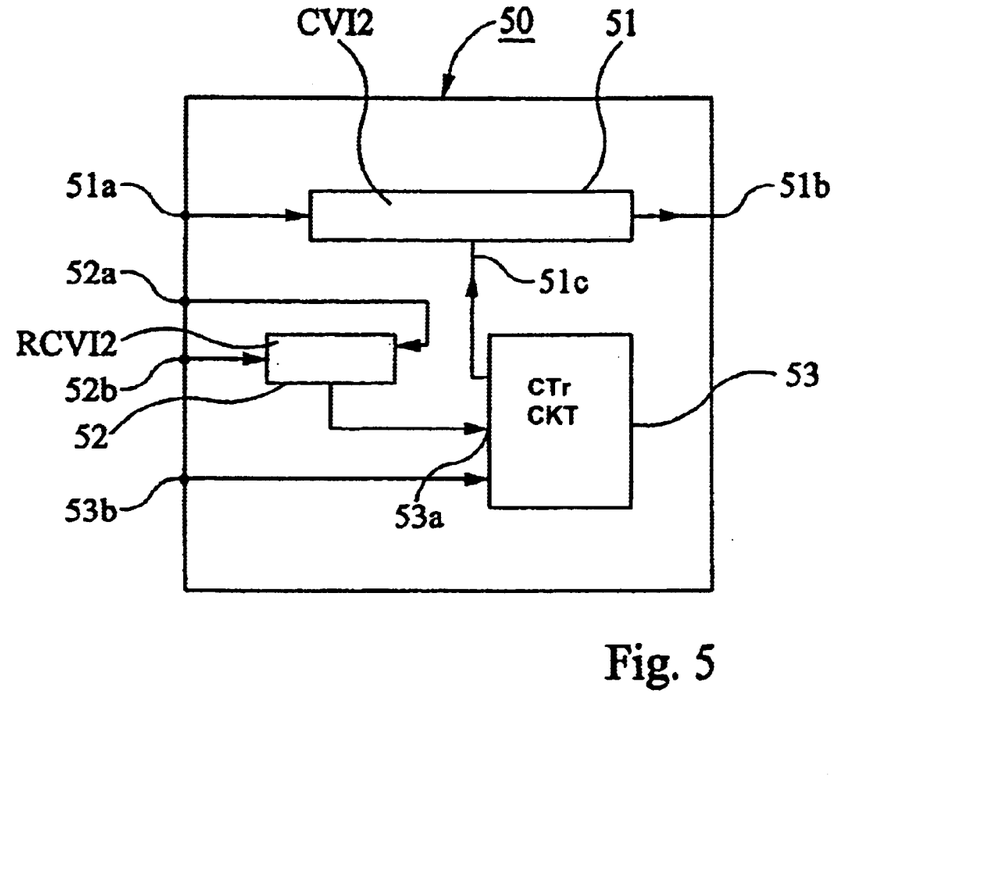
FIG. 5 illustrates a block diagram of a semi-conductor circuit having a delay circuit.

A further embodiment will be shortly presented in connection with FIG. 5. E.g., when doing development work on a circuit, it may be necessary to examine how a signal, that will be delayed in a cable, influences the function of the circuit. For this purpose, during an experiment, it may be time consuming to use a real cable, and an alternative is to use an arrangement illustrated in FIG. 5. This figure illustrates a semiconductor substrate 50 having an adjustable delay circuit 51, a reference delay circuit 52 and a control circuit 53. The delay circuit 51 is provided with a signal input 51a and a signal output 51b for the signal that is to be delayed, as well as a control terminal 51c for the control circuit. The reference delay circuit 52 is provided with terminals 52a and 52b for reference clock pulses and a terminal 53a for the control circuit. The control circuit is also provided with a terminal 53b for setting a desired delay interval T1. The arrangement is used so that the number of delay elements RCVI2 of the reference delay circuit are set by means of the reference clock pulses, which here have a mutually time distance T2. This setting has been disclosed in connection with the FIGS. 3 and 4. The value RCVI2 is stored in the control circuit 53 and an operator inputs the desired delay interval T1. In the control circuit the quotient $$POS=T1/T2 \quad (3)$$

is calculated.

It should be noted the quotient in this embodiment is calculated based on the time intervals T1 and T2, and not on the number of delay elements, as is the case according to equation (1). However, the calculations are equivalent, as the delay elements 31 on a certain semi-conductor substrate correspond to a determined delay time and the quotient POS is not influenced. The number of delay element (CVI2) that are to be used is calculated in the control circuit 53 according to equation (2) and the resulting value is set in the delay circuit 51. Thus this value will correspond to the desired delay time T1. The number of delay elements corresponding to the delay time T1 and the delay distance T2 will vary from one semi-conductor circuit 50 to the next, as has been explained above. However, the quotient POS is not affected by these circumstances and the circuit 50 may easily be set on a desired delay time, independently of which circuit specimen that one gets hold of at a specific occasion.

Figure 6:
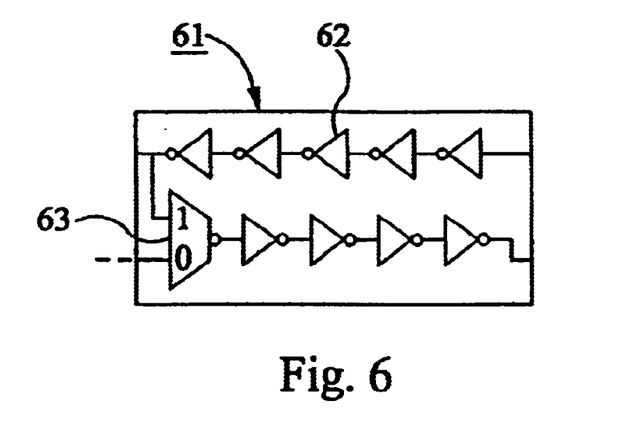
FIG. 6 illustrates a block diagram of a delay element.

In the above examples, the delay elements 31 in both the adjustable delay circuit and the fixed delay circuit have an equal number of inverters 32. According to an alternative, the delay elements are designed as illustrated in FIG. 6. These delay elements 61 have an upper row provided with five cascade coupled inverters 62 and a lower row provided with four inverters cascade coupled with one inverter-multiplexer 63. The delay elements 61 have usually a longer delay than the delay elements 31. A semi-conductor circuit, corresponding to the circuit SCA, may be provided with both the delay elements 31 and the delay elements 61. Here, e.g., the adjustable delay circuit ADA may comprise the delay elements 61, whereas the reference delay circuit RDA is built up by the delay elements 31. In the embodiment described in connection with FIG. 2, where the semi-conductor circuit SCA1 replaces the semi-conductor circuit SCA, the calculations according to the equations (1) and (2) are not affected by the different numbers of inverters in the delay elements. The two semi-conductor circuits are similar in so far that they are provided with the same kind of delay elements on corresponding locations. According to the embodiment illustrated in FIG. 5, where the delay time T1 is to be generated directly in a time unit according to equations (3) and (2), these equations must however be compensated for the relationship between the delay times of the delay elements 31 and 61.

Arrangements having even more complicated relationships regarding the number of inverters in its associated delay elements may exist. E.g., a semi-conductor circuit according to the embodiment in FIG. 2 may have all the delay elements of the same design, both in the reference delay circuit and in the adjustable delay circuit. When a new semi-conductor circuit replaces the semi-conductor circuit, the new circuit may e.g. be provided with the delay elements 61 in its associated reference delay circuit and the delay elements 31 in its associated adjustable delay circuit. In this case, the calculations according to the equations (1) and (2) must be compensated for the different number of inverters in each delay element. A man skilled in the art may, by means of the above example, produce further embodiments.

Figure 7:
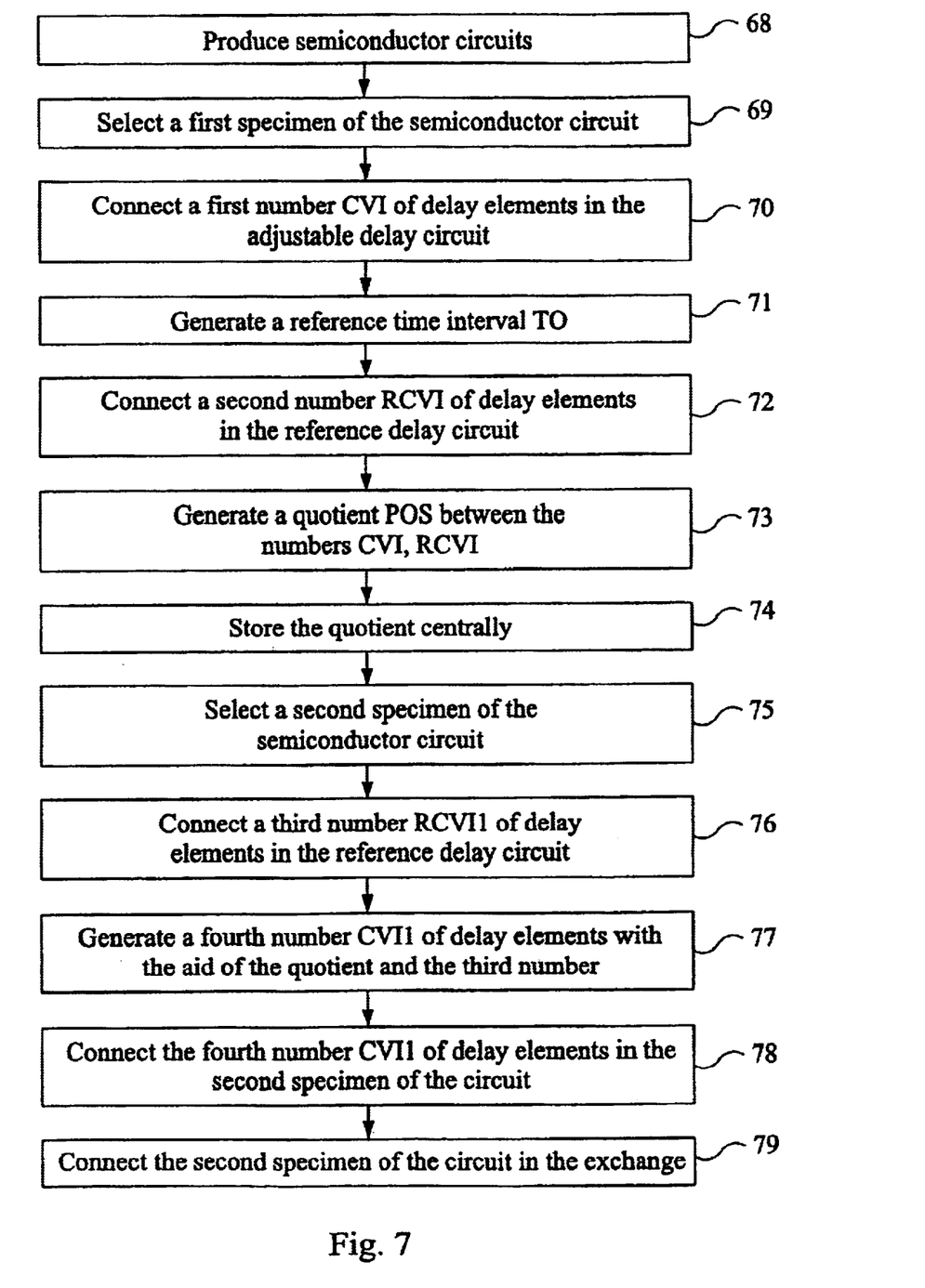
FIG. 7 illustrates a flow chart of a method according to the invention.

In connection with the flow chart in FIG. 7, a method according to the above description will be summarized. A step 68 of the method shows that the semi-conductor circuits SCA and SCA1 in FIG. 2 are manufactured. Thus, these circuits are produced on different semi-conductor substrates. In step 69, the first semi-conductor circuit specimen is selected, e.g. the semi-conductor circuit SCA that is connected for participating in the synchronization of the exchange AXE1. In a step 70, the first number CV1 of the delay elements 31 or 61 are connected in the adjustable delay circuit ADA. I step 71, the reference time interval T0 is generated. In step 72, the second number RCV1 of delay elements 31 or 61, which are accommodated within the reference time interval T0, are connected in the reference delay circuit RDA. Values indicating the two numbers CV1 and RCV1 of delay elements are stored and the quotient POS between these two values is generated in a following step 73. In a step 74, the quotient POS is stored in the master control unit 3 in the exchange AXE1. The storing is performed centrally in order to enable the circuit SCA to be exchanged without losing the quotient POS. When the circuit SCA is to be exchanged, the circuit SCA1 is selected, according to a step 75 as a substitute, the circuit SCA1 being the second semi-conductor circuit specimen. The third number RCVI1 of delay elements are connected in the reference delay circuit RDA1 of the semi-conductor circuit SCA1 according to a step 76. The fourth number CVI1 of the delay elements is calculated by means of the stored quotient POS and the third number RCVI1 of delay elements according to equation (2), as is indicated in a step 77. In a step 78, the fourth number CVI1 of the delay elements in the adjustable delay circuit ADA1 are connected, and according to a step 79, the semi-conductor circuit SCA1 is connected in order to participate in the synchronization of the exchange AXE1.

Figure 8:
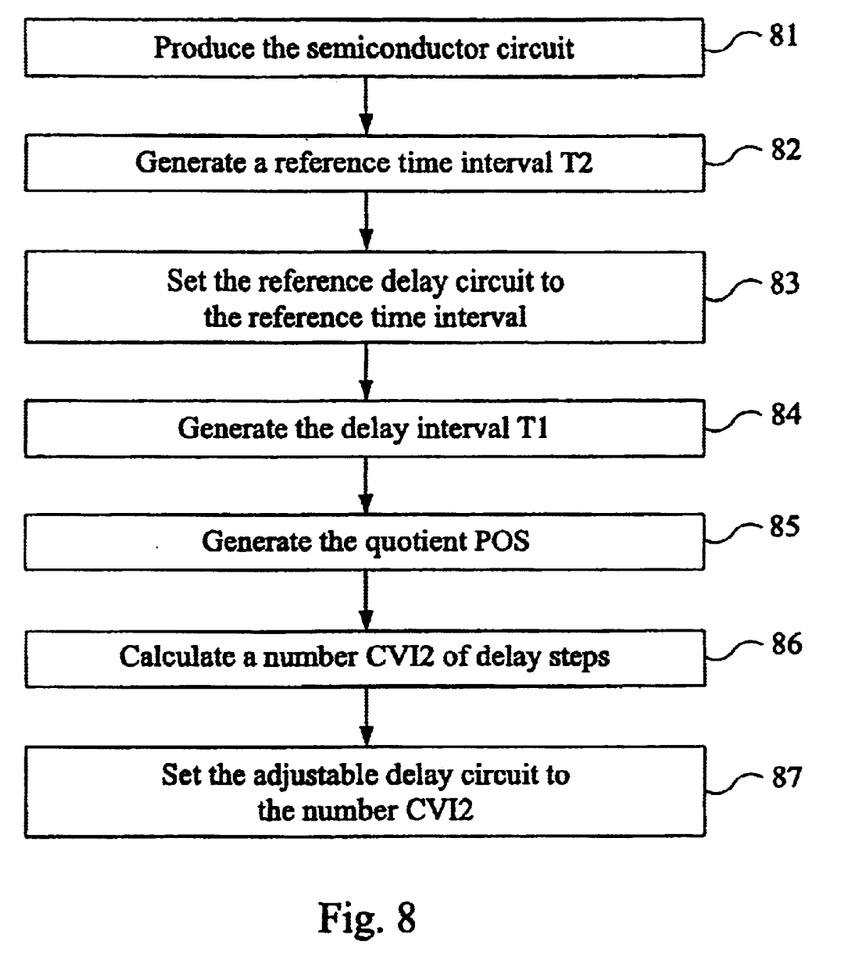
FIG. 8 illustrates a flow chart of another method according to the invention.

Yet another method described above is to be summarized in connection with FIG. 8. In step 81, the semi-conductor circuit 50 with the adjustable delay circuit 51 and the reference delay circuit 52 is produced. In a step 82, a reference time interval T2 is generated, and the reference delay circuit 52 is set, according to'a step 83, on said time interval. Thus, this involves that said number RCVI2 of delay elements are connected. In a step 84, the desired delay interval T1 is generated, and in a step 85, the quotient POS=T1/T2 is generated. The value CVI2=POS*RCVI2 indicating the number of delay elements is generated according to a step 86, and in a step 87 the adjustable delay circuit 51 is set at the value CVI2.

What is claimed is:

1. An apparatus for delaying signals in a semi-conductor circuit, comprising:

an adjustable delay circuit for delaying a signal a first predetermined delay interval, the adjustable delay circuit comprising a number of essentially identical delay elements;

a reference delay circuit having a number of essentially identical delay elements, wherein the adjustable delay circuit and the reference delay circuit are produced on a common semi-conductor substrate;

means used for generating a reference time interval;

means for setting the reference delay circuit in said reference time interval; and means for setting the adjustable delay circuit on the first predetermined delay interval by utilizing the reference delay circuit.

2. The apparatus according to claim 1 further comprising:

a first and a second semi-conductor circuit specimen, wherein the adjustable delay circuit of the first specimen is set on the first predetermined delay interval and the first specimen's associated reference delay circuit is set an the reference time interval; and means for setting the adjustable delay circuit of the second semi-conductor circuit specimen includes means for using the settings of the first semi-conductor circuit specimen.

3. The apparatus according to claim 1, wherein the delay elements include an inverting multiplexer and at least one inverter, which are interconnected, the adjustable delay circuit and the reference delay circuit having a different amount of the at least one inverters in their respective delay elements.

4. The apparatus according to claim 1 further comprising:
   means for determining a reference number of the delay elements in the reference delay circuit that are required for a time delay corresponding to the reference time interval;
   means for generating a quotient of the first predetermined delay interval and the reference time interval; and
   means for setting the adjustable delay circuit at a number of the delay elements corresponding to the first predetermined delay interval, said value being generated by means of said quotient and the reference number.

5. The apparatus according to claim 4, wherein the delay elements include a multiplexer interconnected to at least one inverter, the adjustable delay circuit and the reference delay circuit having an equal number of the inverters in their respective delay elements and the number of the delay elements in the adjustable delay circuit is generated by multiplying said quotient with the reference number of the delay elements.

6. The apparatus according to claim 1 further comprising:
   means for setting an adjustable delay circuit of the first semi-conductor circuit specimen on a first number of the delay elements, corresponding to the predetermined delay interval;
   means for setting the reference delay circuit of the first semi-conductor circuit specimen on a second number of the delay elements by means of the reference time interval;
   means for generating and storing a quotient of the first and the second number;
   means for, at the second semi-conductor circuit specimen, storing a third reference number of the delay elements in the reference delay circuit corresponding to the reference time interval;
   means for generating a fourth number of the delay elements by means of said quotient and the third reference number of the delay elements; and
   means for connecting the fourth number of the delay elements in the adjustable delay circuit of the second semi-conductor circuit specimen.

7. The apparatus according to claim 6, wherein the first semi-conductor circuit specimen is used in a circuit for synchronizing clock signals, and the second semi-conductor circuit specimen, replacing the first semi-conductor circuit specimen, is set on the same delay time as said first semi-conductor circuit specimen, when it is connected in the circuit for synchronizing.

8. The apparatus according to claim 7, wherein the delay elements include an inverting multiplexer and at least one inverter, which are interconnected, the adjustable delay circuit and the reference delay circuit having an equal number of inverters in their respective delay elements.

9. A method for delaying signals in a semi-conductor circuit with a first predetermined delay interval, wherein the semi-conductor circuit includes a number of substantially identical delay elements, comprising the steps of:
   producing on a common semi-conductor substrate both a reference delay circuit having a number of essentially identical delay elements, and an adjustable delay circuit;
   generating a reference time interval;
   setting the reference delay circuit at said reference time interval; and
   setting the adjustable delay circuit at a first predetermined delay interval by means of the reference delay circuit.

10. The method according to claim 9, further comprising:
    determining a reference number of delay elements of the reference delay circuit that are required for a time delay corresponding to the reference time interval;
    generating a quotient of the first predetermined delay interval-and the reference time interval;
    generating of a number of the delay elements corresponding to the first predetermined delay interval, by multiplying said quotient with the reference number; and
    setting the adjustable delay circuit at the reference number of the delay elements.

11. The method according to claim 9, further comprising:
    selecting a first and a second semi-conductor circuit specimen;
    setting the adjustable delay circuit of the first semi-conductor circuit specimen at the first predetermined delay interval and setting the first semi-conductor circuit specimen's associated reference delay circuit at the reference time interval; and
    setting the adjustable delay circuit of the second semi-conductor circuit specimen utilizing the settings of the first semi-conductor circuit specimen.

12. The method according to claim 11, further comprising:
    setting a first number of the delay elements of the first adjustable delay circuit-on the first semi-conductor circuit specimen, corresponding to the predetermined delay interval;
    setting a second number of the delay elements of the reference delay circuit on the first semi-conductor circuit specimen by means of the reference time interval;
    generating and storing of a quotient of the first and second number;
    registering a third number of delay elements in the reference delay circuit of the second semi-conductor circuit specimen, said third number corresponding to the reference time interval;
    generating a fourth number of the delay elements by means of said quotient and the third number of the delay elements; and
    connecting the fourth number of the delay elements in the adjustable delay circuit of the second semi-conductor circuit specimen.

13. The method according to claim 12, further comprising:
    utilizing the first semi-conductor circuit specimen in a circuit for synchronizing clock signals, the second semi-conductor circuit specimen being set on the same delay time as the first semi-conductor circuit specimen; and
    replacing the first semi-conductor circuit specimen with the second semi-conductor circuit specimen for maintaining synchronization.

* * * * *

UNITED STATES PATENT AND TRADEMARK OFFICE
CERTIFICATE OF CORRECTION

PATENT NO. : 6,900,683 B2 Page 1 of 1
APPLICATION NO. : 10/433518
DATED : May 31, 2005
INVENTOR(S) : Lindberg et al.

It is certified that error appears in the above-identified patent and that said Letters Patent is hereby corrected as shown below:

On the Title Page, Field (57), under "ABSTRACT", in Column 2, Line 17, after "circuit" insert --,--.

In Column 2, Line 49, delete "semiconductor" and insert -- semi-conductor --, therefor.

In Column 10, Line 61, in Claim 2, delete "an" and insert -- on --, therefor.

In Column 12, Line 12, in Claim 10, after "interval" delete "-".

In Column 12, Line 13, in Claim 10, after "number" insert -- (CVI2) --.

In Column 12, Line 28, in Claim 11, after "circuit" insert -- (ADAI) --.

In Column 12, Lines 31-32, in Claim 12, delete "further comprising:" and insert -- characterized in: --, therefor.

In Column 12, Line 34, in Claim 12, after "circuit" delete "-".

In Column 12, Line 39, in Claim 12, after "circuit" insert -- (RDA) --.

Signed and Sealed this

Thirteenth Day of November, 2007

JON W. DUDAS
*Director of the United States Patent and Trademark Office*